(12) United States Patent
Ku (10) Patent No.: US 8,373,478 B2
(45) Date of Patent: Feb. 12, 2013

(54) SEMICONDUCTOR DEVICE AND DELAY LOCKED LOOP CIRCUIT THEREOF

(75) Inventor: Young-Jun Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/337,566

(22) Filed: Dec. 27, 2011

(65) Prior Publication Data

US 2012/0274373 A1    Nov. 1, 2012

(30) Foreign Application Priority Data

Apr. 27, 2011 (KR) ........................ 10-2011-0039635

(51) Int. Cl.
*H03L 7/06* (2006.01)
(52) U.S. Cl. ........................ 327/158; 327/149
(58) Field of Classification Search .................. 327/149, 327/158
See application file for complete search history.

(56) References Cited

U.S. PATENT DOCUMENTS

| 6,486,716 | B1* | 11/2002 | Minami et al. | 327/152 |
| 6,959,062 | B1* | 10/2005 | Stubbs | 375/376 |
| 7,605,623 | B2* | 10/2009 | Yun et al. | 327/158 |
| 7,843,240 | B2* | 11/2010 | Kim | 327/158 |
| 7,847,618 | B2* | 12/2010 | Gebara et al. | 327/536 |
| 7,994,831 | B2* | 8/2011 | Lee et al. | 327/158 |
| 8,005,180 | B2* | 8/2011 | Fujinuma et al. | 375/371 |
| 2008/0079470 | A1* | 4/2008 | Yun et al. | 327/158 |
| 2009/0174441 | A1* | 7/2009 | Gebara et al. | 327/115 |
| 2009/0174447 | A1* | 7/2009 | Lee et al. | 327/158 |
| 2010/0052748 | A1* | 3/2010 | Kim | 327/158 |

* cited by examiner

*Primary Examiner* — Adam Houston
(74) *Attorney, Agent, or Firm* — IP & T Group LLP (57) ABSTRACT

A semiconductor device includes a first phase detector for detecting a phase of a second clock by comparing the phase of the second clock with the phase of the first clock, a second phase detector for detecting a phase of a clock obtained by delaying the second clock by a set delay amount, a third phase detector for detecting the phase of the second clock by delaying the first clock by the set delay amount, and a phase difference detection signal generator for setting a logic level of a phase difference detection signal corresponding to a phase difference between the first and second clocks detecting that the phase of the first or second clock is changed, and change the logic level of the phase difference detection signal.

12 Claims, 6 Drawing Sheets

# SEMICONDUCTOR DEVICE AND DELAY LOCKED LOOP CIRCUIT THEREOF

CROSS-REFERENCE TO RELATED APPLICATIONS

The present application claims priority of Korean Patent Application No. 10-2011-0039635, filed on Apr. 27, 2011, which is incorporated herein by reference in its entirety.

BACKGROUND

1. Field

Exemplary embodiments of the present invention relate to semiconductor design technology, and more particularly, to a circuit for synchronizing a phase between two clocks, and a delay locked loop circuit of a semiconductor device, to which the circuit is applied.

2. Description of the Related Art

A synchronous semiconductor memory device such as a double data rate synchronous DRAM (DDR SDRAM) transmits data to an external device outside of the semiconductor memory device using an internal clock synchronized with an external clock inputted from the external device such as a memory controller.

This clock structure and configuration is implemented because the temporal synchronization between an external clock applied from the memory controller to the memory device and data outputted from the memory device is very important for the purpose of stable transmission between the memory device and the memory controller.

In the example as described above, the data outputted in the memory device is outputted in synchronization with the internal clock. The internal clock is initially applied to the memory device in the state where the internal clock is synchronized with the external clock, but the internal clock is delayed while passing through each component in the memory device. Therefore, the internal clock is outputted to the outside of the memory device in the state where the internal clock is not synchronized with the external clock.

Accordingly, to perform stable transmission of data outputted from the memory device, the internal and external clocks is to be synchronized with each other so that the internal clock is exactly positioned at an edge or center of the external clock applied from the memory controller when transmitting data on a bus.

A phase locked loop (PLL) circuit and a delay locked loop (DLL) circuit are used as clock synchronization circuits for performing the function described above.

In an example where the frequencies of the external and internal clocks are different from each other, the PLL circuit is frequently used, which performs a frequency rearranging function. However, in an example where the frequencies of the external and internal clocks are identical to each other, the DLL circuit is frequently used. The DLL circuit also may be implemented in a relatively small area without being influenced by noise, as compared with the PLL circuit.

More specifically, since the frequencies of the internal and external clocks used in the semiconductor memory device are identical to each other, the DLL circuit is frequently used as a clock synchronization circuit.

Figure 1:
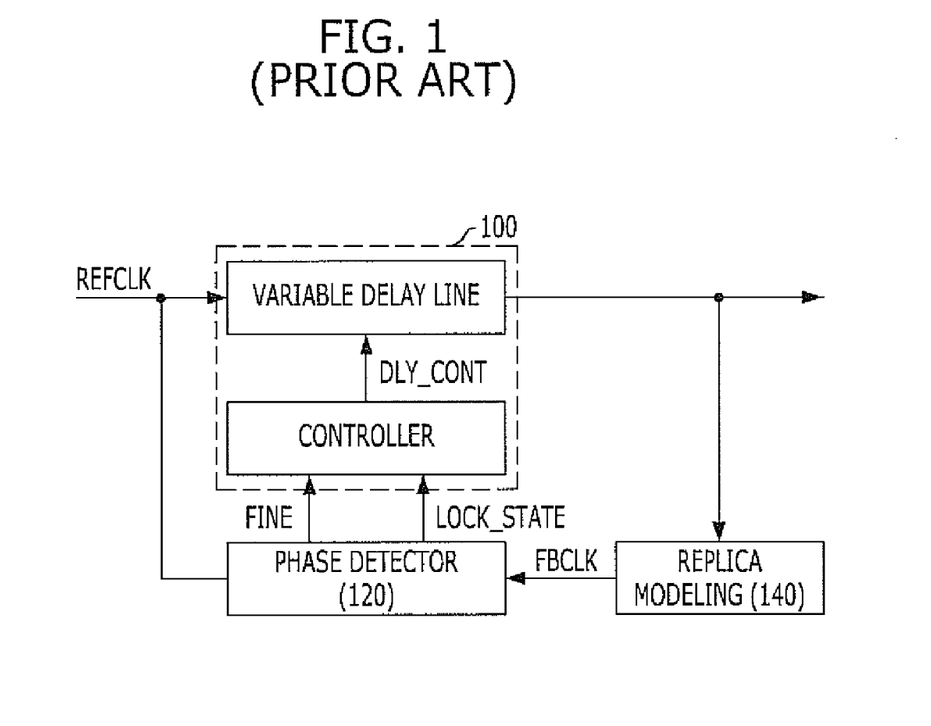
FIG. 1 is a block diagram illustrating a DLL of a semiconductor device.

FIG. 1 is a block diagram illustrating a DLL of a semiconductor device.

Referring to FIG. 1, the general DLL of the semiconductor device includes a phase detector 120, a clock delay 100, and a replica modeling 140. The phase detector 120 compares the phase of a source clock REFCLK with the phase of a feedback clock FBCLK, and generates a phase comparison signal FINE and a phase difference detection signal LOCK_STATE corresponding to the compared result. The clock delay 100 delays the source clock REFCLK through a variable delay line and outputs a delay locked clock DLLCLK. In the variable delay line, a delay amount is controlled in response to the phase difference detection signal LOCK_STATE, and a change direction of the delay amount is controlled in response to the phase comparison signal FINE. The replica modeling 140 delays the delay locked clock DLLCLK by a delay amount tREP obtained by modeling an input delay path of the source clock REFCLK and an output delay path of the delay locked clock DLLCLK, and the replica modeling 140 outputs the delayed delay locked clock DLLCLK as the feedback clock FBCLK.

Here, the clock delay 100 includes a variable delay line and a controller. The variable delay line delays the source clock REFCLK by a delay amount corresponding to a delay control signal DLY_CONT, and the variable delay line outputs the delayed source clock REFCLK as the delay locked clock DLLCLK. The controller generates the delay control signal DLY_CONT in response to the phase comparison signal FINE and the phase difference detection signal LOCK_STATE.

Figure 2:
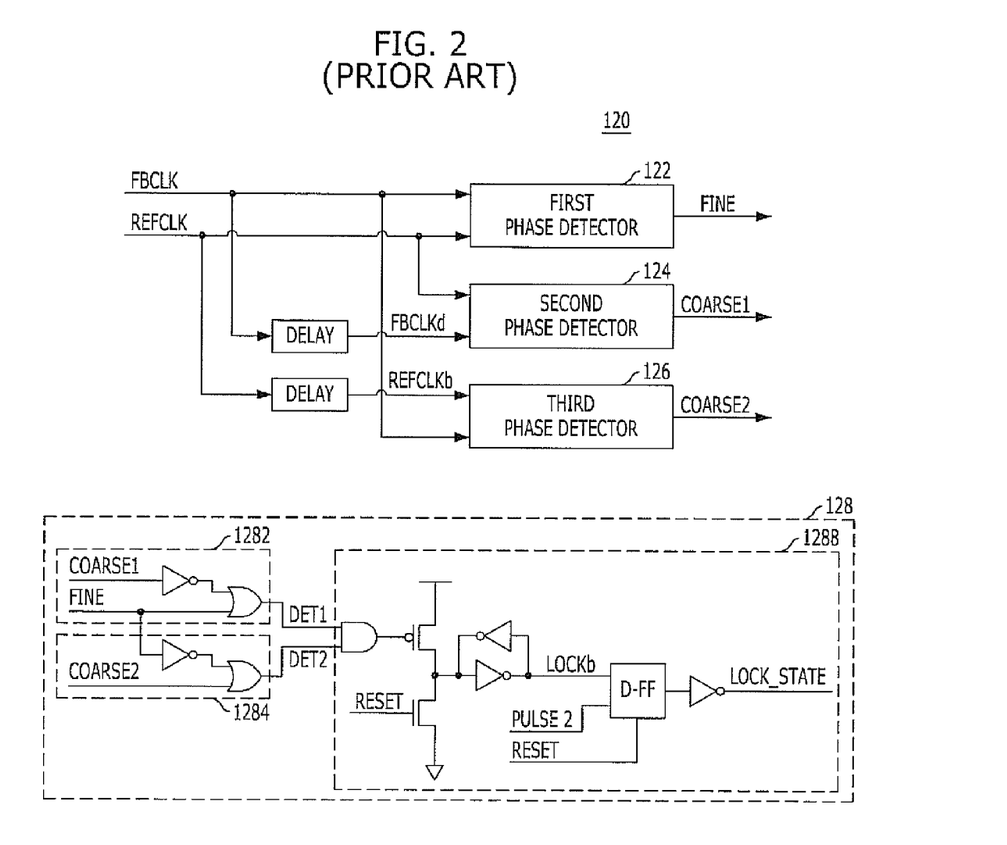
FIG. 2 is a circuit diagram illustrating a detailed configuration of a conventional phase comparator among components of the general DLL circuit of the semiconductor device illustrated in FIG. 1.

FIG. 2 is a circuit diagram illustrating a detailed configuration of a conventional phase comparator of the DLL circuit of the semiconductor device illustrated in FIG. 1.

Referring to FIG. 2, the related art phase comparator 120 includes a first phase detector 122, a second phase detector 124, a third phase detector 126, and a phase difference detection signal generator 128. The first phase detector 122 detects the phase of a feedback clock FBCLK based on the phase of a source clock REFCLK. The second phase detector 124 detects the phase of a clock FBCLKd obtained by delaying the feedback clock FBCLK by a set delay amount DELAY based on the phase of the source clock REFCLK. The third phase detector 126 detects the phase of the feedback clock FBCLK based on the clock REFCLKd obtained by delaying the source clock REFCLK by the delay amount DELAY. The phase difference detection signal generator 128 determines the logic level of a phase difference detection signal LOCK_STATE corresponding to a phase difference between the source clock REFCLK and the feedback clock FBCLK in response to signals FINE, COARSE1, and COARSE 2 respectively outputted from the first to third phase detectors 122, 124 and 126.

Here, the phase difference detection signal generator 128 includes a first phase difference detector 1282, a second phase difference detector 1284, and a phase difference detection signal output 1288. The first phase difference detector 1282 detects whether or not the phase of the feedback clock FBCLK is within the phase difference corresponding to the delay amount DELAY in response to the signal FINE outputted from the first phase detector 122 and the signal COARSE1 outputted from the second phase detector 124. The second phase difference detector 1284 detects whether or not the phase of the feedback clock FBCLK is within the phase difference corresponding to the delay amount DELAY in response to the signal FINE outputted from the first phase detector 122 and the signal COARSE2 outputted from the third phase detector 126. The phase difference detection signal output 1288 outputs a phase difference detection signal LOCK_STATE having a logic level that is determined in response to an output signal DET1 of the first phase difference detector 1282 and an output signal DET2 of the second phase difference detector 1284.

Figure 3:
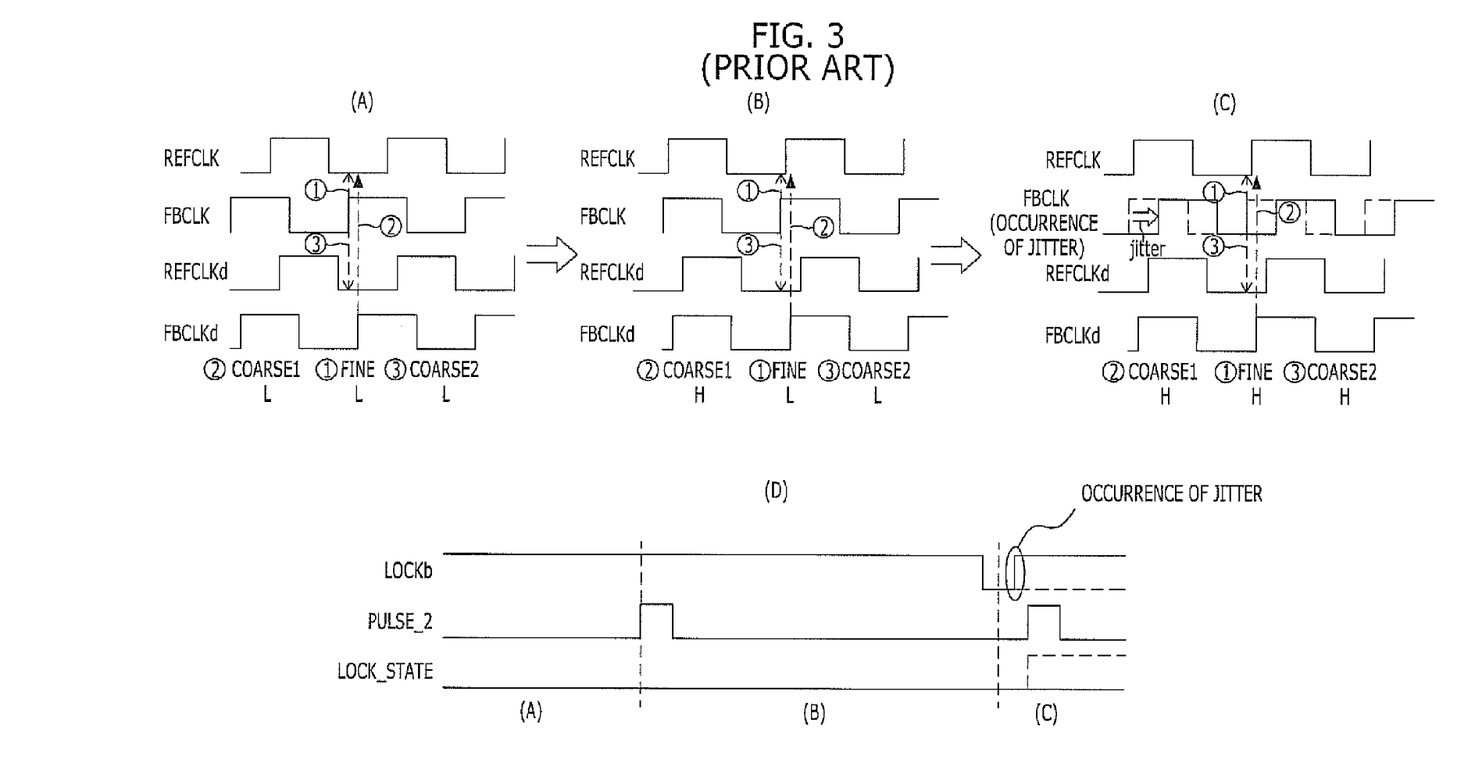
FIG. 3 is a timing diagram illustrating an operation of the conventional phase comparator illustrated in FIG. 2.

FIG. 3 is a timing diagram illustrating an operation of the conventional phase comparator illustrated in FIG. 2.

Referring to FIG. 3, the related art phase comparator 120 illustrates timing diagrams of examples (A), (B) and (C). In example (A), the phase difference between the source clock REFCLK and the feedback clock FBCLK is greater than the phase difference corresponding to the set delay amount DELAY. In example (B), the phase difference between the source clock REFCLK and the feedback clock FBCLK is smaller than the phase difference corresponding to the set delay amount DELAY. In example (C), a jitter occurs in the case (B) where the phase difference between the source clock REFCLK and the feedback clock FBCLK is smaller than the phase difference corresponding to the set delay amount DELAY, and therefore, the state of the case (B) is changed into a state where the phase difference between the source clock REFCLK and the feedback clock FBCLK is greater than the phase difference corresponding to the set delay amount DELAY.

Referring to example (A), the logic level of the source clock REFCLK at a rising edge of the feedback clock FBCLK will be described so as to detect the phase of the feedback clock FBCLK based on the phase of the source clock REFCLK. As shown with reference to ①, the logic level of the source clock REFCLK becomes a non-activated state as logic 'low' so that the output signal FINE of the first phase detector 122 becomes the logic 'Low.' Next, the logic level of the source clock REFCLK at a rising edge of a clock FBCLKd obtained by delaying the feedback clock FBCLK by the set delay amount DELAY will be described so as to detect the phase of the clock FBCLKd obtained by delaying the feedback clock FBCLK by the set delay amount DELAY. As shown with reference to ②, the logic level of the source clock REFCLK becomes a non-activated state as logic 'Low' so that the output signal COARSE1 of the second phase detector 124 becomes the logic 'Low.' Next, the logic level of the clock REFCLKd obtained by delaying the source clock REFCLK by the set delay amount DELAY at a rising edge of the feedback clock FBCLK will be described so as to detect the phase of the feedback clock FBCLK based on the clock REFCLKd obtained by delaying the source clock REFCLK by the set delay amount DELAY. As shown with reference to ③ the logic level of the clock REFCLKd becomes a non-activated state as logic 'Low' so that the output signal COARSE2 of the third phase detector 126 becomes the logic 'Low.'

As such, in example (A) where the phase difference between the source clock REFCLK and the feedback clock FBCLK is greater than the phase difference corresponding to the set delay amount DELAY, the output signals FINE, COARSE1 and COARSE1 of the first to third phase detectors 122, 124 and 126 all become logic 'Low,' and therefore, the phase difference detection signal LOCK_STATE also maintains the non-activated state as logic 'Low.' Thus, the interval for changing the phase of the feedback clock FBCLK becomes a relatively high state so as to synchronize the phases of the source clock REFCLK and the feedback clock FBCLK with each other, and accordingly, the example (A) can be moved at a time to the case (B) where the phase difference between the source clock REFCLK and the feedback clock FBCLK is smaller than the phase difference corresponding to the set delay amount DELAY. In example (B), the interval for changing the phase of the feedback clock FBCLK becomes a relatively high state meaning that the phase of the feedback clock FBCLK is changed into a coarse operation mode in a general DLL circuit. Generally, the phase of the feedback clock FBCLK is changed for each delay amount corresponding to two unit delays every update period.

First, the logic level of the source clock REFCLK at a rising edge of the feedback clock FBCLK will be described so as to detect the phase of the feedback clock FBCLK based on the phase of the source clock REFCLK. As shown with reference to ①, the logic level of the source clock REFCLK becomes a non-activated state as logic 'Low' so that the output signal FINE of the first phase detector 122 becomes the logic 'Low.' However, the logic level of the source clock REFCLK at a rising edge of a clock FBCLKd obtained by delaying the feedback clock FBCLK by the set delay amount DELAY will be described so as to detect the phase of the clock FBCLKd obtained by delaying the feedback clock FBCLK by the set delay amount DELAY. As shown with reference to ②, the logic level of the source clock REFCLK becomes an activated state as logic 'High' so that the output signal COARSE1 of the second phase detector 124 becomes logic 'High.' Next, the logic level of the clock REFCLKd obtained by delaying the source clock REFCLK by the set delay amount DELAY at a rising edge of the feedback clock FBCLK will be described so as to detect the phase of the feedback clock FBCLK based on the clock REFCLKd obtained by delaying the source clock REFCLK by the set delay amount DELAY. As shown with reference to ③, the logic level of the clock REFCLKd becomes a non-activated state as logic 'Low' so that the output signal COARSE2 of the third phase detector 126 becomes logic 'Low.'

As such, in example (B) where the phase difference between the source clock REFCLK and the feedback clock FBCLK is smaller than the phase difference corresponding to the set delay amount DELAY, the output signals FINE and COARSE 2 of the first and third phase detectors 122 and 126 become logic 'Low,' and the output signal COARSE1 of the second phase detector 124 becomes logic 'High.' Therefore, the phase difference detection signal LOCK_STATE is also changed from the non-activated state as logic 'low' to the activated state as logic 'High.' Thus, the interval for changing the phase of the feedback clock FBCLK is to be in a relatively low state so as to synchronize the phase of the source clock REFCLK and the phase of the feedback clock FBCLK with each other. In this example, the interval for changing the phase of the feedback clock FBCLK is to be in a relatively low state meaning that the phase of the feedback clock FBCLK is changed into a fine operation mode in the general DLL circuit. Generally, the phase of the feedback clock FBCLK is changed for each delay amount smaller than one unit delay every update period.

For reference, although the update period corresponding to a time when the phase of the feedback clock FBCLK is changed is not directly illustrated in this figure, the update period generally becomes a time corresponding to toggling of an update pulse toggled just after the output signal FINE of the first phase detector 122.

In an example where the phase difference between the source clock REFCLK and the feedback clock FBCLK is greater than the phase difference corresponding to the set delay amount DELAY, the phase of the feedback clock FBCLK is changed by the delay amount corresponding to the two unit delays. In an example where the phase difference between the source clock REFCLK and the feedback clock FBCLK is smaller than the phase difference corresponding to the set delay amount DELAY, the phase of the feedback clock FBCLK is changed by the delay amount smaller than the unit delay. Hence, the size of the set delay amount DELAY is to be set to a size corresponding to the delay amount slightly that is greater than the unit delay. If the size of the set delay amount DELAY is set to an extremely great value, the phase difference between the source clock REFCLK and the feedback clock FBCLK becomes a state that the phase difference between the source clock REFCLK and the feedback clock FBCLK is smaller than that corresponding to the set delay amount DELAY at an extremely fast update timing, and accordingly, an operation is extended in the state that the phase difference between the source clock REFCLK and the feedback clock FBCLK is smaller than the phase difference corresponding to the set delay amount DELAY. Therefore, the size of the set delay amount DELAY is necessarily set to a state having a delay amount slightly greater than the unit delay.

Meanwhile, the time at which the logic level of the phase difference detection signal LOCK_STATE is changed corresponding to the output signals FINE, COARSE1 and COARSE2 of the first to third phase detectors 122, 124 and 126 becomes a time at which an operation pulse PULSE_2 is toggled. More specifically, the time at which the logic level of the phase difference detection signal LOCK_STATE is changed is substantially determined based on the toggling of the operation pulse PULSE_2 after the output signals FINE, COARSE1 and COARSE2 of the first to third phase detectors 122, 124 and 126 are determined. Although not directly illustrated in this figure, the toggling time of the operation pulse PULSE_2 is generally a time later than that of a corresponding update pulse just after the output signal FINE of the first phase detector 122 is generated.

Therefore, the phase of the feedback clock FBCLK is changed in response to the output signal FINE of the first phase detector 122 at the toggling time of the update pulse before the logic level of the phase difference detection signal LOCK_STATE is substantially changed through the output signals FINE, COARSE1 and COARSE2 of the first to third phase detectors 122, 124 and 126 in example (B) where the phase difference between the source clock REFCLK and the feedback clock FBCLK is smaller than the phase difference corresponding to the set delay amount DELAY.

As shown in example (C) where a jitter occurs in example (B) where the phase difference between the source clock REFCLK and the feedback clock FBCLK is smaller than the phase difference corresponding to the set delay amount DELAY, and therefore, the state of example (B) is changed into a state where the phase difference between the source clock REFCLK and the feedback clock FBCLK is greater than the phase difference corresponding to the set delay amount DELAY. In example (C), where a jitter occurs in the source clock REFCLK or the feedback clock FBCLK at the toggling time of the update pulse, the phase of the source clock REFCLK or the feedback clock FBCLK is fluctuated by a delay amount two times greater than the delay amount corresponding to the set delay amount DELAY, and all the output signals FINE, COARSE1 and COARSE2 of the first to third phase detectors 122, 124 and 126 are changed into logic 'High.' Therefore, the phase difference detection signal LOCK_STATE is not changed from logic 'Low' to logic 'High' but continuously maintains the state of logic 'Low.'

Due to this issue, the phase change interval of the feedback clock FBCLK is continuously maintained as a high state. More specifically, the DLL circuit continuously performs the coarse mode operation. Therefore, the DLL circuit operates only in a manner where the feedback clock FBCLK is continuously delayed. As a result, the delay amount of the variable delay line reaches a limit value, and accordingly, the delay locking operation fails.

SUMMARY

An embodiment of the present invention is directed to a semiconductor device having a circuit for synchronizing the phases of two clocks, which can detect a jitter when the jitter occurs in any one of the two clock and synchronize the phase of the two clocks by applying the detected result to a phase synchronization operation between the two clocks.

Another embodiment of the present invention is directed to a DLL circuit of a semiconductor device to which a circuit capable of synchronizing the phases of two clocks is applied.

In accordance with an embodiment of the present invention, a semiconductor device includes a first phase detector configured to detect a phase of a second clock by comparing the phase of the second clock with a phase of a first clock; a second phase detector configured to detect a phase of a clock obtained by delaying the second clock by a delay amount by comparing the phase of the delayed second clock with the phase of the first clock; a third phase detector configured to detect the phase of the second clock by comparing the phase of the second clock with a phase of a clock obtained by delaying the first clock by the delay amount; and a phase difference detection signal generator configured to set a logic level of a phase difference detection signal corresponding to a phase difference between the first and second clocks in response to signals respectively outputted from the first to third phase detectors, detect that the phase of the first or second clock is changed by a phase corresponding an amount two times greater than the delay amount, and change the logic level of the phase difference detection signal in response to the detected result.

In accordance with another embodiment of the present invention, a delay locked loop (DLL) circuit of as semiconductor device includes a phase comparator configured to compare phases of a source clock and a feedback clock and generate a phase comparison signal and a phase difference detection signal corresponding to the compared result; a clock delay configured to delay the source clock through a variable delay line and output the delayed source clock as a delay locked clock, wherein the variable delay line controls the variation width of a delay amount in response to the phase difference detection signal and controls the variation direction of the delay amount in response to the phase comparison signal; and a replica modeling configured to delay the delay locked clock by a delay amount obtained by modeling an input delay path of the source clock and an output delay path of the delay locked clock and output the delayed delay locked clock as the feedback clock, wherein the phase comparator comprises: a first phase detector configured to detect the phase of the feedback clock by comparing the phase of the second clock with the phase of the source clock; a second phase detector configured to detect a phase of a clock obtained by delaying the feedback clock by a set delay amount by comparing the phase of the delayed second clock with the phase of the source clock; a third phase detector configured to detect the phase of the feedback clock by comparing the phase of the second clock with a phase of a clock obtained by delaying the source clock by the set delay amount; and a phase difference detection signal generator configured to set a logic level of the phase difference detection signal corresponding to a phase difference between the source clock and the feedback clock in response to signals respectively outputted from the first to third phase detectors, detect that the phase of the feedback clock is changed by a phase corresponding an amount two times greater than the delay amount, and change the logic level of the phase difference detection signal in response to the detected result.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
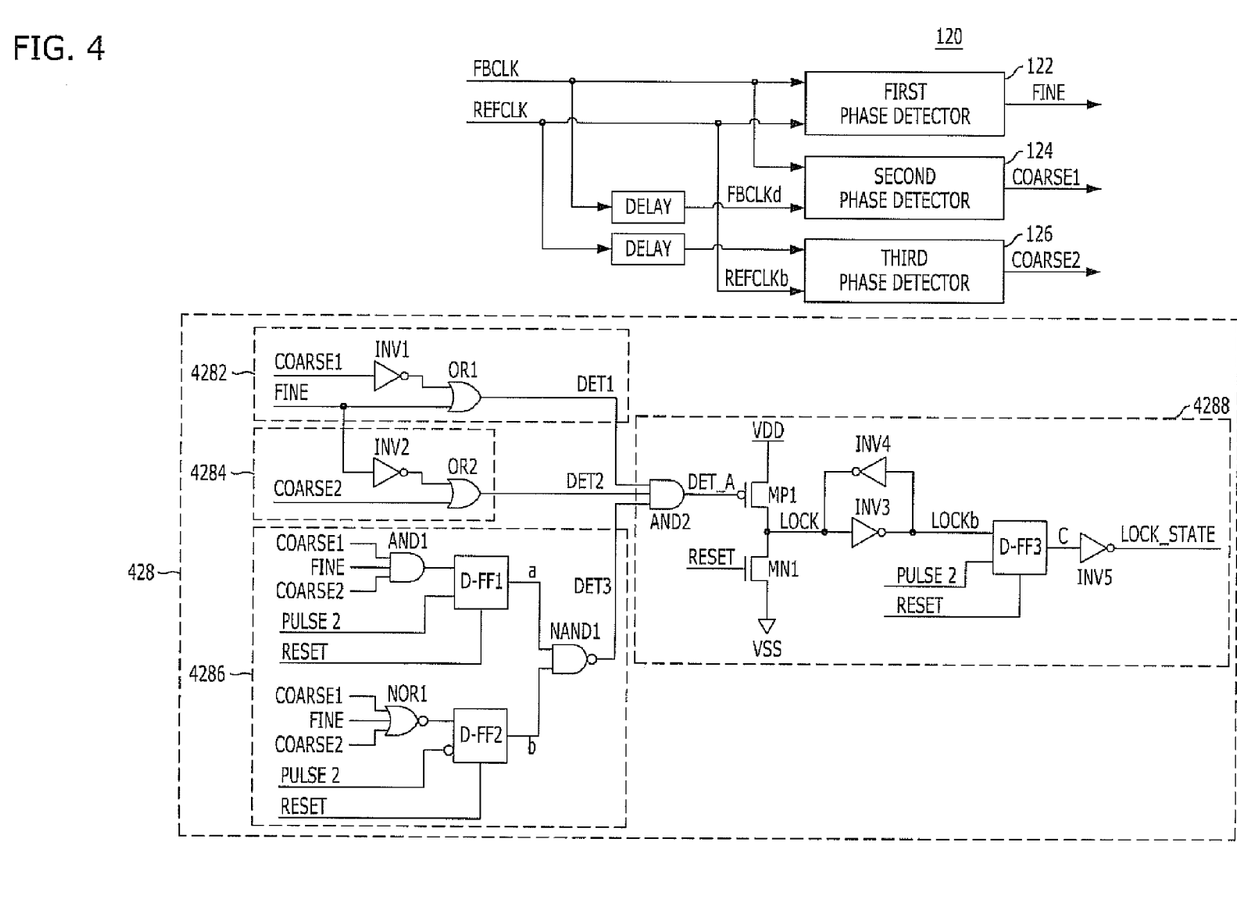
FIG. 4 is a circuit diagram illustrating a detailed configuration of a phase comparator among components of a general DLL circuit of a semiconductor device in accordance with an embodiment of the present invention.

FIG. 4 is a circuit diagram illustrating a detailed configuration of a phase comparator among components of a general DLL circuit of a semiconductor device in accordance with an embodiment of the present invention.

Although not directly illustrated in FIG. 4, the configuration of the general DLL circuit of the semiconductor device can be described with reference to that of FIG. 1.

More specifically, the DLL of the semiconductor device includes a phase comparator 120, a clock delay 100 and a replica modeling 140. The phase detector 120 compares the phase of a source clock REFCLK with the phase of a feedback clock FBCLK, and generates a phase comparison signal FINE and a phase difference detection signal LOCK_STATE, corresponding to the compared result. The clock delay 100 delays the source clock REFCLK through a variable delay line and a delay locked clock DLLCLK. In the variable delay line, a delay amount is controlled in response to the phase difference detection signal LOCK_STATE, and a change direction of the delay amount is controlled in response to the phase comparison signal FINE. The replica modeling 140 delays the delay locked clock DLLCLK by a delay amount tREP obtained by modeling an input delay path of the source clock REFCLK and an output delay path of the delay locked clock DLLCLK, and the replica modeling 140 outputs the delayed delay locked clock DLLCLK as the feedback clock FBCLK.

Referring to FIG. 4, the phase comparator 120 in accordance with the embodiment of the present invention includes a first phase detector 122, a second phase detector 124, a third phase detector 126, and a phase difference detection generator 428. The first phase detector 122 detects the phase of a feedback clock FBCLK based on the phase of a source clock REFCLK. The second phase detector 124 detects the phase of a clock REFCLKd obtained by delaying the feedback clock FBCLK by a set delay amount DELAY based on the phase of the source clock REFCLK. The third phase detector 126 detects the phase of the feedback clock FBCLK based on the clock REFCLKd obtained by delaying the source clock REFCLK by the delay amount DELAY. The phase difference detection signal generator 428 sets the logic level of a phase difference detection signal LOCK_STATE corresponding to a phase difference between the source clock REFCLK and the feedback clock FBCLK in response to signals FINE, COARSE1 and COARSE 2 respectively outputted from the first to third phase detectors 122, 124, and 126. The phase difference detection signal generator 428 detects that the phase of the feedback clock FBCLK is suddenly changed, which means that the phase of the feedback clock FBCLK is changed by a delay amount two times greater than the set delay amount DELAY, and reflects the detected result to the determination of the logic level of the phase difference detection signal LOCK_STATE.

Here, the phase difference detection signal generator 428 includes a first phase difference detector 4282, a second phase difference detector 4284, a third phase difference detector 4286, and a phase difference detection signal output 4288. The first phase difference detector 4282 detects whether or not the phase of the feedback clock FBCLK is within the phase difference corresponding to the delay amount DELAY set so that the phase of the feedback clock FBCLK is later than that of the source clock REFCLK in response to the signal FINE outputted from the first phase detector 122 and the signal COARSE1 outputted from the second phase detector 124. The second phase difference detector 4284 detects whether or not the phase of the feedback clock FBCLK is within the phase difference corresponding to the delay amount DELAY set so that the phase of the feedback clock FBCLK is later than that of the source clock REFCLK in response to the signal FINE outputted from the first phase detector 122 and the signal COARSE2 outputted from the third phase detector 126. The third phase detector 4286 detects whether or not the phase of the feedback clock FBCLK is changed by a delay amount two times greater than of the set delay amount DELAY in response to the signals FINE, COARSE1 and COARSE2 respectively outputted from the first to third phase detectors 122, 124 and 126. The phase difference detection signal output 4288 outputs a phase difference detection signal LOCK_STATE, and the logic level of the phase difference detection signal LOCK_STATE is determined in response to an output signal DET1 of the first phase difference detector 4282, an output signal DET2 of the second phase difference detector 4284, and an output signal DET3 of the third phase difference detector 4286.

The first phase difference detector 4282 includes a first inverter INV1 and a first OR gate OR1. The first inverter INV1 receives the output signal COARSE1 of the second phase detector 124 and outputs a signal obtained by inverting the phase of the output signal COARSE1. The first OR gate OR1 receives the output signal FINE of the first phase detector 122 and the output signal of the first inverter INV1 and performs a logical operation of the output signals. Subsequently, the first OR gate OR1 outputs the result obtained by performing the logical OR gate operation of the output signals as the output signal DET1 of the first phase difference detector 4282.

The second phase difference detector 4284 includes a second inverter INV2 and a second OR gate OR2. The second inverter INV2 receives the output signal FINE of the first phase detector 122 and outputs a signal obtained by inverting the phase of the output signal FINE. The second OR gate OR2 receives the output signal COARSE2 of the third phase detector 126 and the output signal of the first inverter INV2 and performs a logical operation of the output signals. Subsequently, the second OR gate OR2 outputs the result obtained by performing the logical OR gate operation of the output signals as the output signal DET2 of the second phase difference detector 4284.

The third phase difference detector 4286 includes a first AND gate AND1, a first D-flip flop D-FF1, a first NOR gate NOR1, a second D-flip flop D-FF2, and a first NAND gate NAND 1. The first AND gate AND1 receives the output signals FINE, COARSE1 and COARSE2 of the first to third phase detectors 122, 124 and 126 and performs a logical AND gate operation of the output signals. The first D-flip flop D-FF1 outputs the output signal of the first AND gate AND1 as a first flip-flop output signal 'a' in response to toggling of an operation pulse PULSE2, or the first D-flip flop D-FF1 initiates the first flip-flop output signal 'a' in response to a reset signal RESET. The first NOR gate NOR1 receives the output signals FINE, COARSE1 and COARSE2 of the first to third phase detectors 122, 124 and 126 and performs a logical NOR gate operation of the output signals. The second D-flip flop D-FF2 outputs the output signal of the first NOR gate NOR1 as a second flip-flop output signal 'b' in response to the toggling of the operation pulse PULSE2, or the second D-flip flop D-FF2 initiates the second flip-flop output signal 'b' in response to the reset signal RESET. The first NAND gate NAND 1 receives the first flip-flop output signal 'a' and the second flip-flop output signal 'b' and performs a logical NAND gate operation of the output signals. Subsequently, the first NAND gate NAND 1 outputs the result obtained by performing the logical NAND gate operation of the output signals as the output signal DET3 of the third phase difference detector 4286.

The phase difference detection signal output 4288 includes a second AND gate AND 2, a first PMOS transistor PM1, a first NMOS transistor MN1, third and fourth inverters INV3 and INV 4, a third D-flip flop D-FF3, and a fifth inverter INV5. The second AND gate AND 2 receives the output signals FINE, COARSE1 and COARSE2 of the first to third phase detectors 122, 124 and 126 and performs a logical AND gate operation of the output signals. The first PMOS transistor PM1 drives an output node LOCK to an external power voltage VDD in response to an output signal DET_A of the second AND gate AND2 applied to a gate of the first PMOS transistor PM1. The first NMOS transistor MN1 drives the output node LOCK to an external ground voltage VSS in response to the reset signal RESET applied to a gate of the first NMOS transistor MN1. The third and fourth inverters INV3 and INV 4 output a signal LOCKb obtained by inverting the phase of the output node LOCK and latch the value of the signal LOCKb. The third D-flip flop D-FF3 outputs the output signal LOCKb of the third inverter INV3 as a third flip-flop output signal 'c' in response to the toggling of the operation pulse PULSE2, the third D-flip flop D-FF3 or initiates the third flip-flop output signal 'c' in response to the reset signal RESET. The fifth inverter INV5 receives the third flip-flop output signal 'c' and inverts the phase of the third flip-flop output signal 'c.' Subsequently, the fifth inverter INV5 outputs the output signal as the phase difference detection signal LOCK_STATE.

Where the logic levels of the output signals FINE, COARSE1 and COARSE2 respectively outputted from the first to third phase detectors 122, 124 and 126, which become a non-activated state as logic 'Low' after an initiation operation, are all changed into an activated state of logic 'High,' the third phase difference detector 4286 detects that the phase of the feedback clock FBCLK is changed by a delay amount two times greater than the set delay amount DELAY.

For reference, where the logic levels of the output signals FINE, COARSE1 and COARSE2 respectively outputted from the first to third phase detectors 122, 124 and 126, which become an activated state as logic 'High' after the initiation operation, are all changed into a non-activated state of logic 'Low,' the third phase difference detector 4286 does not detect that the phase of the feedback clock FBCLK is changed by a delay amount two times greater than the set delay amount DELAY. This detection is because the first to third phase detectors 122, 124 and 126 all perform the phase detection operation based on a rising edge. If the first to third phase detectors 122, 124 and 126 all perform the phase detection operation based on a falling edge, the third phase difference detector 4286 reversely detects the change in phase.

Where the operational condition of any one of the first to third is phase difference detectors 122, 124, and 126 is satisfied, the phase difference detection signal output 4288 activates the phase difference detection signal LOCK_STATE. More specifically, where any one of the output signals DET1, DET2, and DET3 of the first to third phase difference detectors 122, 124, and 126 is changed into the non-activated state as logic 'Low' so as to satisfy the operational condition, the phase difference detection signal output 4288 changes the phase difference detection signal LOCK_STATE from the non-activated state as logic 'Low' to the activated state as logic 'High.'

The clock delay 100 changes a delay amount of the variable delay line by a first variation width in a period where the phase difference detection signal LOCK_STATE is non-activated as logic 'Low,' and the clock delay 100 changes the delay amount of the variable delay line by a second delay variation smaller than the first delay width in a period where the phase difference detection signal LOCK_STATE is activated as logic 'High.' More specifically, the clock delay 100 operates in a coarse mode in the period where the phase difference detection signal LOCK_STATE is non-activated as logic 'Low' so as to change the delay amount of the variable delay line for each delay amount corresponding two unit delays. The clock delay 100 operates in a fine mode in the period where the phase difference detection signal LOCK_STATE is activated as logic 'High' so as to change the delay amount of the variable delay line for each delay amount smaller than the unit delay.

Figure 5:
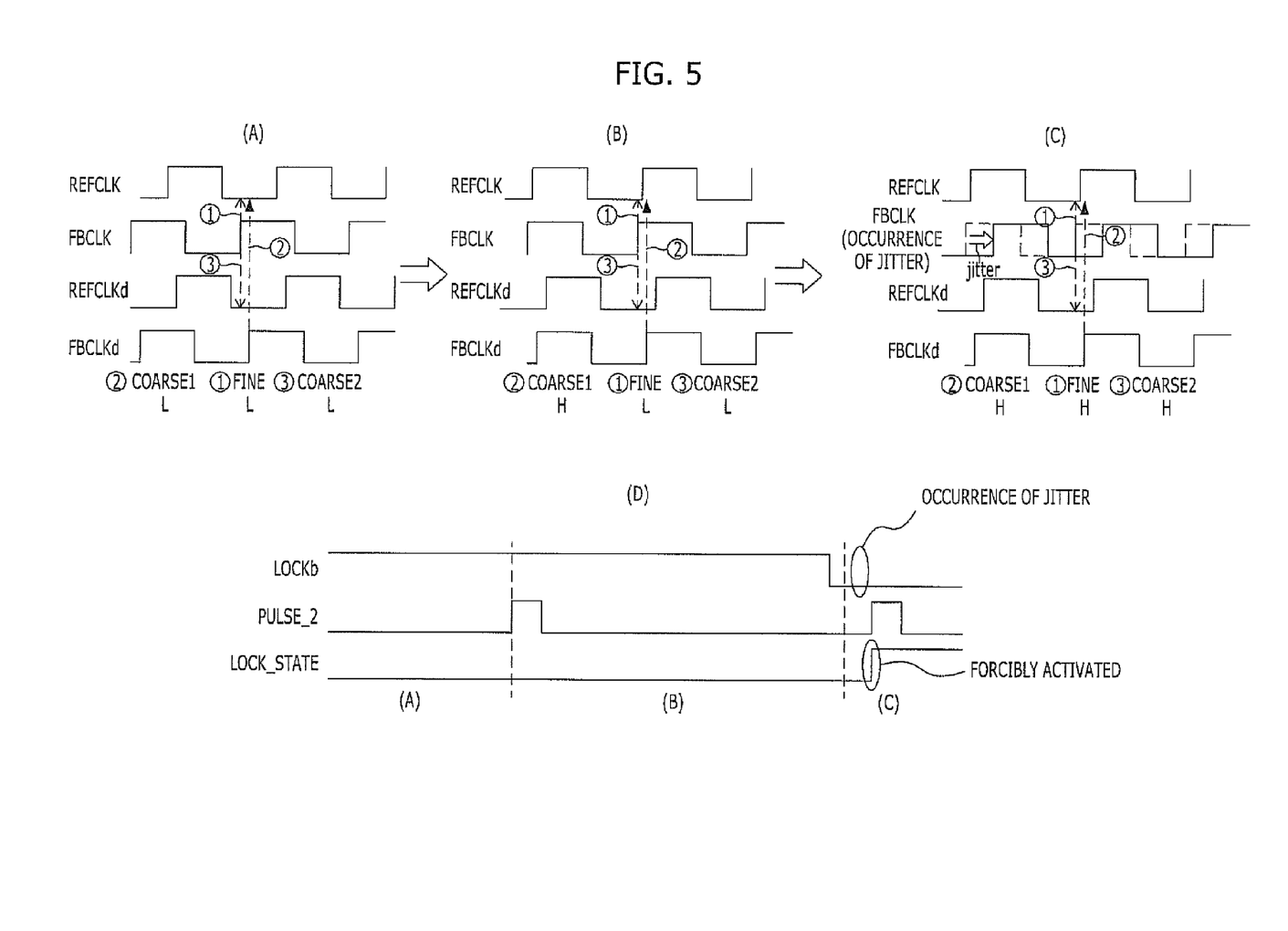
FIG. 5 is a timing diagram illustrating an operation of the phase comparator illustrated in FIG. 4 in accordance with the embodiment of the present invention.

FIG. 5 is a timing diagram illustrating an operation of the phase comparator illustrated in FIG. 4 in accordance with the embodiment of the present invention.

Referring to FIG. 5, the phase comparator 120 in accordance with the embodiment of the present invention illustrates timing diagrams of examples (A), (B) and (C). In example (A), the phase difference between the source clock REFCLK and the feedback clock FBCLK is greater than the phase difference corresponding to the set delay amount DELAY. In example (B), the phase difference between the source clock REFCLK and the feedback clock FBCLK is smaller than the phase difference corresponding to the set delay amount DELAY. In example (C), a jitter occurs in example (B) where the phase difference between the source clock REFCLK and the feedback clock. FBCLK is smaller than the phase difference corresponding to the set delay amount DELAY, and therefore, the state of example (B) is changed into a state where the phase difference between the source clock REFCLK and the feedback clock FBCLK is greater than the phase difference corresponding to the set delay amount DELAY.

Referring to example (A), the logic level of the source clock REFCLK at a rising edge of the feedback clock FBCLK will be described so as to detect the phase of the feedback clock FBCLK based on the phase of the source clock REFCLK. As shown with reference to ①, the logic level of the source clock REFCLK becomes a non-activated state as logic 'Low' so that the output signal FINE of the first phase detector 122 becomes the logic 'Low.' Next, the logic level of the source clock REFCLK at a rising edge of a clock FBCLKd obtained by delaying the feedback clock FBCLK by the set delay amount DELAY will be described so as to detect the phase of the clock FBCLKd obtained by delaying the feedback clock FBCLK by the set delay amount DELAY. As shown with reference to ②, the logic level of the source clock REFCLK becomes a non-activated state as logic 'Low' so that the output signal COARSE1 of the second phase detector 124 becomes the logic 'Low.' Next, the logic level of the clock REFCLKd obtained by delaying the source clock REFCLK by the set delay amount DELAY at a rising edge of the feedback clock FBCLK will be described so as to detect the phase of the feedback clock FBCLK based on the clock REFCLKd obtained by delaying the source clock REFCLK by the set delay amount DELAY. As shown with reference to ③, the logic level of the clock REFCLKd becomes a non-activated state as logic 'low' so that the output signal COARSE2 of the third phase detector 126 becomes the logic 'Low.'

As such, in example (A) where the phase difference between the source clock REFCLK and the feedback clock FBCLK is greater than phase difference corresponding to the set delay amount DELAY, the output signals FINE, COARSE1 and COARSE1 of the first to third phase detectors 122, 124 and 126 all become logic 'Low,' and therefore, the phase difference detection signal LOCK_STATE also maintains the non-activated state as logic 'Low.' Thus, the interval for changing the phase of the feedback clock FBCLK becomes a relatively high state so as to synchronize the phases of the source clock REFCLK and the feedback clock FBCLK with each other, and accordingly, example (A) can be moved at a time to example (B) where the phase difference between the source clock REFCLK and the feedback clock FBCLK is smaller than the phase difference corresponding to the set delay amount DELAY. In this example, the interval for changing the phase of the feedback clock FBCLK becomes a relatively high state meaning that the phase of the feedback clock FBCLK is changed into a coarse operation mode in a general DLL circuit. Generally, the phase of the feedback clock FBCLK is changed for each delay amount corresponding to two unit delays every update period.

First, the logic level of the source clock REFCLK at a rising edge of the feedback clock FBCLK will be described so as to detect the phase of the feedback clock FBCLK based on the phase of the source clock REFCLK. As shown with reference to ①, the logic level of the source clock REFCLK becomes a non-activated state as logic 'Low' so that the output signal FINE of the first phase detector 122 becomes the logic 'Low.' However, the logic level of the source clock REFCLK at a rising edge of a clock FBCLKd obtained by delaying the feedback clock FBCLK by the set delay amount DELAY will be described so as to detect the phase of the clock FBCLKd obtained by delaying the feedback clock FBCLK by the set delay amount DELAY. As shown with reference to ②, the logic level of the source clock REFCLK becomes an activated state as logic 'High' so that the output signal COARSE1 of the second phase detector 124 becomes logic 'High.' Next, the logic level of the clock REFCLKd obtained by delaying the source clock REFCLK by the set delay amount DELAY at a rising edge of the feedback clock FBCLK will be described so as to detect the phase of the feedback clock FBCLK based on the clock REFCLKd obtained by delaying the source clock REFCLK by the set delay amount DELAY. As shown with reference to ③, the logic level of the clock REFCLKd becomes a non-activated state as logic 'Low' so that the output signal COARSE2 of the third phase detector 126 becomes logic 'Low.'

As such, in example (B) where the phase difference between the source clock REFCLK and the feedback clock FBCLK is smaller than the phase difference corresponding to the set delay amount DELAY, the output signals FINE and COARSE 2 of the first and third phase detectors 122 and 126 become logic 'Low,' and the output signal COARSE1 of the second phase detector 124 becomes logic 'High.' Therefore, the phase difference detection signal LOCK_STATE is also changed from the non-activated state as logic 'Low' to the activated state as logic 'High.' Thus, the interval for changing the phase of the feedback clock FBCLK is to be in a relatively low state so as to synchronize the phase of the source clock REFCLK and the phase of the feedback clock FBCLK with each other. In this example, the interval for changing the phase of the feedback clock FBCLK is to be in a relatively low state meaning that the phase of the feedback clock FBCLK is changed into a fine operation mode in the general DLL circuit. Generally, the phase of the feedback clock FBCLK is changed for each delay amount smaller than one unit delay every update period.

For reference, although the update period corresponding to a time when the phase of the feedback clock FBCLK is changed is not directly illustrated in this figure, the update period generally becomes a time corresponding to toggling of an update pulse toggled just after the output signal FINE of the first phase detector 122.

In an example where the phase difference between the source clock REFCLK and the feedback clock FBCLK is greater than the phase difference corresponding to the set delay amount DELAY, the phase of the feedback clock FBCLK is changed by the delay amount corresponding to the two unit delays. In an example where the phase difference between the source clock REFCLK and the feedback clock FBCLK is smaller than the phase difference corresponding to the set delay amount DELAY, the phase of the feedback clock FBCLK is changed by the delay amount smaller than the unit delay. Hence, the size of the set delay amount DELAY is to be set to a size corresponding to the delay amount slightly greater than the unit delay. If the size of the set delay amount DELAY is set to an extremely great value, the phase difference between the source clock REFCLK and the feedback clock FBCLK becomes a state that the phase difference between the source clock REFCLK and the feedback clock FBCLK is smaller than that corresponding to the set delay amount DELAY at an extremely fast update timing, and accordingly, an operation is extended in the state that the phase difference between the source clock REFCLK and the feedback clock FBCLK is smaller than the phase difference corresponding to the set delay amount DELAY. Therefore, the size of the set delay amount DELAY is necessarily set to a state having a delay amount slightly greater than the unit delay.

Meanwhile, the time at which the logic level of the phase difference detection signal LOCK_STATE is changed corresponding to the output signals FINE, COARSE1 and COARSE2 of the first to third phase detectors 122, 124 and 126 becomes a time when an operation pulse PULSE_2 is toggled. More specifically, the time at which the logic level of the phase difference detection signal LOCK_STATE is changed is substantially determined based on the toggling of the operation pulse PULSE_2 after the output signals FINE, COARSE1 and COARSE2 of the first to third phase detectors 122, 124 and 126 are determined. Although not directly illustrated in this figure, the toggling time of the operation pulse PULSE_2 is generally a time later than that of a corresponding update pulse just after the output signal FINE of the first phase detector 122 is generated.

Therefore, the phase of the feedback clock FBCLK is changed in response to the output signal FINE of the first phase detector 122 at the toggling time of the update pulse before the logic level of the phase difference detection signal LOCK_STATE is substantially changed through the output signals FINE, COARSE1 and COARSE2 of the first to third phase detectors 122, 124 and 126 in example (B) where the phase difference between the source clock REFCLK and the feedback clock FBCLK is smaller than the phase difference corresponding to the set delay amount DELAY.

As shown in example (C) where a jitter occurs in example (B) where the phase difference between the source clock REFCLK and the feedback clock FBCLK is smaller than the phase difference corresponding to the set delay amount DELAY, and therefore, the state of example (B) is changed into a state where the phase difference between the source clock REFCLK and the feedback clock FBCLK is greater than the phase difference corresponding to the set delay amount DELAY. In example (C), where a jitter occurs in the source clock REFCLK or the feedback clock FBCLK at the toggling time of the update pulse, the phase of the source clock REFCLK or the feedback clock FBCLK is fluctuated by a delay amount greater than the delay amount corresponding to the set delay amount DELAY, and all the output signals FINE, COARSE1 and COARSE2 of the first to third phase detectors 122, 124 and 126 are changed into logic 'High.'

More specifically, there occurs a phenomenon in that the output signals FINE, COARSE1 and COARSE2 of the first to third phase detectors 122, 124 and 126 all are changed from the non-activated state as logic 'Low' to the activated state as logic 'High.'

The third phase difference detector 4286 in accordance with the embodiment of the present invention detects that this phenomenon occurs, and forcibly changes the phase difference signal LOCK_STATE from the non-activated state as logic 'Low' to the activated state as logic 'High' in response to the phenomenon.

More specifically, the third phase difference detector 4286 has no influence on the operation of determining the logic level of the phase difference detection signal LOCK_STATE. However, where the general phase difference detection operation is not performed due to the occurrence of the jitter, the third phase difference detector 4286 detects the occurrence of the jitter and influences the operation of determining the logic level of the phase difference detection signal LOCK_STATE.

Although a jitter occurs in the source clock REFCLK or the feedback clock FBCLK during the performance of a delay locking operation, the DLL circuit of the semiconductor device including the phase comparator 120 in accordance with the embodiment of the present invention detects the occurrence of the jitter so that the delay locking operation can be normally performed.

The phase comparator 120 in accordance with the embodiment of the present invention is generally a component included in the DLL circuit of the semiconductor device. Thus, the phase comparator 120 can be applied to the delay locking operation in the DLL circuit of the semiconductor device.

However, although a circuit for synchronizing the phases of two clocks is not included in the DLL circuit of the semiconductor device, the circuit for synchronizing the phases of the two clocks may be applied as follows.

Figure 6:
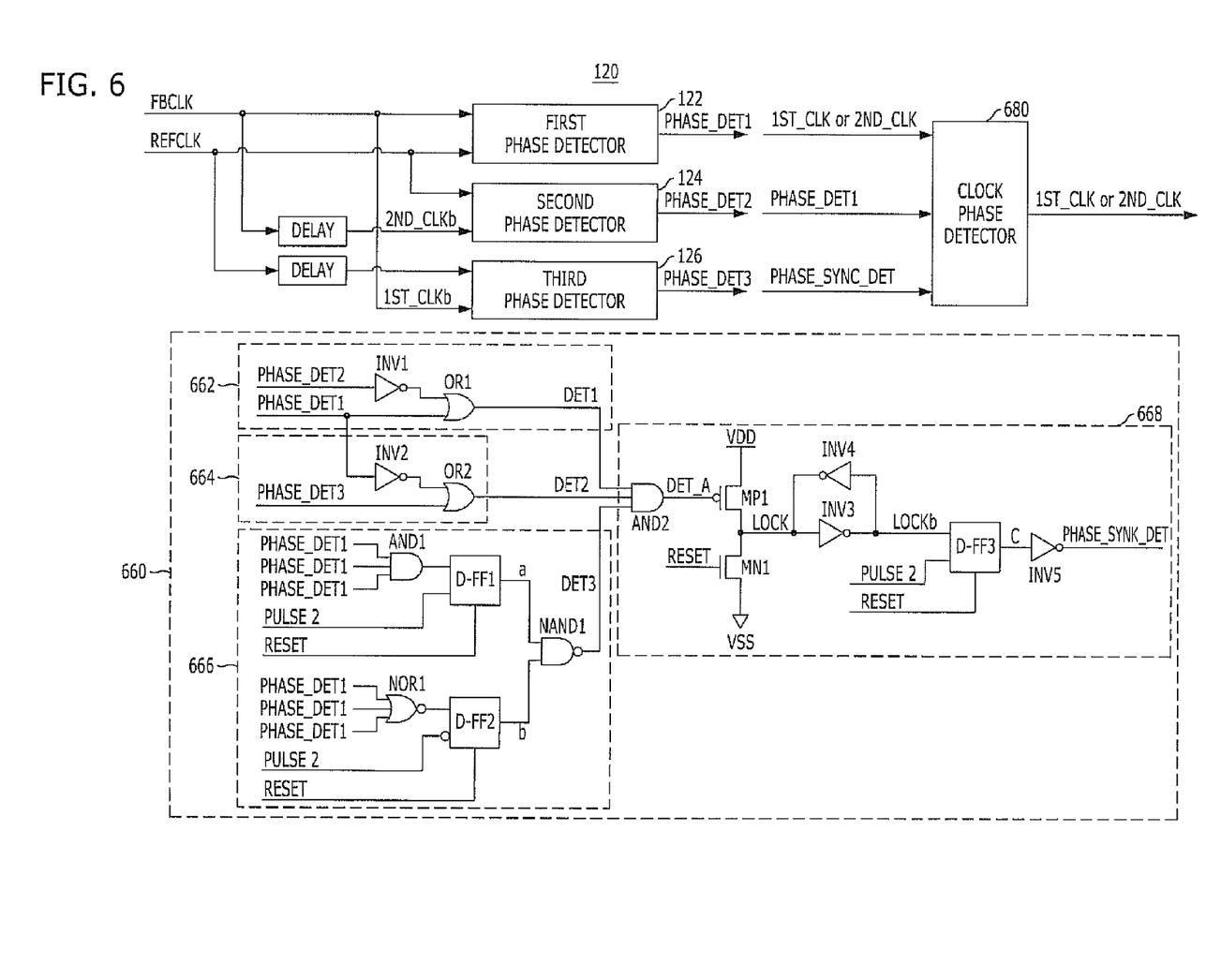
FIG. 6 is a circuit diagram illustrating a configuration of a circuit for synchronizing a phase between two clocks in accordance with the embodiment of the present invention.

FIG. 6 is a circuit diagram illustrating a configuration of a circuit for synchronizing a phase between two clocks in accordance with the embodiment of the present invention.

Referring to FIG. 6, the circuit includes a first phase detector 600, a second phase detector 620, a third phase detector 640, and a phase difference detection signal generator 660. The first phase detector 600 detects the phase of a second clock 2ND_CLK based on the phase of a first clock 1ST_CLK. The second phase detector 620 detects the phase of a clock 2ND_CLKd obtained by delaying the second clock 2ND_CLK by the set delay amount DELAY based on the phase of the first clock 1ST_CLK. The third phase detector 640 detects the phase of the second clock 2ND_CLK based on the phase of a clock 1ST_CLKd obtained by delaying the first clock 1ST_CLK by the set delay amount DELAY. The phase difference detection signal generator 660 determines the logic level of a phase difference detection signal PHASE_SYNC_DET corresponding to the phase difference between the first clock 1ST_CLK and the second clock 2ND_CLK in response to signals PHASE_DET1, PHASE_DET2, and PHASE_DET3 respectively outputted from the first to third phase detectors 600, 620 and 640. The phase difference detection signal generator 660 detects that the phase of the first clock 1ST_CLK or the second clock 2ND_CLK is suddenly changed, which means that the phase of the first clock 1ST_CLK or the second clock 2ND_CLK is changed by a delay amount two times greater than the set delay amount DELAY, and reflects the detected result to the determination of the logic level of the phase difference detection signal PHASE_SYNC_DET. The circuit further includes a clock phase shifter 680 that changes the phase of the first clock 1ST_CLK or the second clock 2ND_CLK in response to the output signal PHASE_DET1 of the first phase detector 600 to synchronize the phases of the first clock 1ST_CLK and the second clock 2ND_CLK, and the clock phase shifter 680 determines the f synchronization of the phases of the first clock 1ST_CLK and the second clock 2ND_CLK in response to the phase difference detection signal PHASE_SYNC_DET.

Here, the phase difference detection signal generator 660 includes a first phase difference detector 662, a second phase difference detector 664, a third phase difference detector 666, and a phase difference detection signal output 668. The first phase difference detector 662 detects whether or not the phase of the second clock 2ND_CLK is within the phase difference corresponding to the delay amount DELAY set so that the phase of the second clock 2ND_CLK is later than that of the first clock 1ST_CLK in response to the signals PHASE_DET1 and PHASE_DET2 respectively outputted from the first and second phase detectors 600 and 620. The second phase difference detector 664 detects whether or not the phase of the second clock 2ND_CLK is within the phase difference corresponding to the delay amount DELAY set so that the phase of the second clock 2ND_CLK is faster than that of the first clock 1ST_CLK in response to the signals PHASE_DET1 and PHASE_DET3 respectively outputted from the first and third phase detectors 600 and 640. The third phase difference detector 666 detects whether or not the phase of the first clock 1ST_CLK or the second clock 2ND_CLK is changed by a delay amount two times greater than of the set delay amount DELAY in response to the signals PHASE_DET1, PHASE_DET2 and PHASE_DET3 respectively outputted from the first to third phase detectors 600, 620 and 640. The phase difference detection signal output 668 outputs a phase difference detection signal PHASE_SYNC_DET, and the logic level of the phase difference detection signal PHASE_SYNC_DET is determined in response to the signals PHASE_DET1, PHASE_DET2, and PHASE_DET3 respectively outputted from the first to third phase detectors 600, 620 and 640.

Where the logic levels of the output signals PHASE_DET1, PHASE_DET2, and PHASE_DET3 respectively outputted from the first to third phase detectors 600, 620 and 640, which become a non-activated state as logic 'Low' after an initiation operation, are all changed into an activated state of logic 'High,' the third phase difference detector 666 detects that the phase of the first clock 1ST_CLK or the second clock 2ND_CLK is changed by a delay amount two times greater than the set delay amount DELAY.

For reference, where the logic levels of the output signals PHASE_DET1, PHASE_DET2, and PHASE_DET3 respectively outputted from the first to third phase detectors 600, 620 and 640, which become an activated state as logic 'High' after the initiation operation, are all changed into a non-activated state of logic 'Low,' the third phase difference detector 666 does not detect that the phase of the first clock 1ST_CLK or the second clock 2ND_CLK is changed by a delay amount two times greater than the set delay amount DELAY. This detection is because the first to third phase detectors 660, 620 and 640 all perform the phase detection operation based on a rising edge. If the first to third phase detectors 660, 620 and 640 all perform the phase detection operation based on a falling edge, the third phase difference detector 666 reversely detects the change in phase.

Where the operational condition of any one of the first to third phase difference detectors 662, 664, and 666 is satisfied, the phase difference detection signal output 668 activates the phase difference detection signal PHASE_SYNC_DET. More specifically, where any one of the output signals DET1, DET2, and DET3 of the first to third phase difference detectors 662, 664, and 666 is changed into the non-activated state as logic 'Low' so as to satisfy the operational condition, the phase difference detection signal output 668 changes the phase difference detection signal PHASE_SYNC_DET from the non-activated state as logic 'Low' to the activated state as logic 'High.'

Where the phase difference detection signal PHASE_SYNC_DET is activated as logic 'High,' the clock phase shifter 680 determines that the phases of the first clock 1ST_CLK and the second clock 2ND_CLK are synchronized with each other, and the clock phase shifter 680 finishes its operation.

As described above, in accordance with the embodiment of the present invention, the circuit for synchronizing the phases of two clocks may be applied to semiconductor devices that receive two clocks to synchronize the phases of the two clocks within a designated range.

Thus, although a jitter occurs in two clocks inputted during the operation of the semiconductor device that receives the two clocks to synchronize the phases of the two clocks within a designated range, the circuit detects the occurrence of the jitter and the phases of the two clocks can be synchronized with each other.

As described above, in accordance with the present invention, although a jitter occurs in a source clock REFCLK or feedback clock FBCLK during the performance of a delay locking operation in the DLL circuit of the semiconductor device, the DLL circuit detects the occurrence of the jitter, and the delay locking operation can be normally performed.

Further, although a jitter occurs in two clocks inputted during the operation of a semiconductor device that receives the two clocks to synchronize the phases of the two clocks within a designated range, the circuit detects the occurrence of the jitter, and the phases of the two clocks can be synchronized with each other.

While the present invention has been described with respect to the specific embodiments, it will be apparent to those skilled in the art that various changes and modifications may be made without departing from the spirit and scope of the invention as defined in the following claims.

For example, the position and type of the logic gates and transistors illustrated in the aforementioned embodiments may be differently implemented depending on the polarity of a signal inputted to the logic gates and transistors.

What is claimed is:

1. A semiconductor device, comprising:
a first phase detector configured to detect a phase of a second clock by comparing the phase of the second clock with a phase of a first clock;
a second phase detector configured to detect a phase of a clock obtained by delaying the second clock by a delay amount by comparing the phase of the delayed second clock with the phase of the first clock;
a third phase detector configured to detect the phase of the second clock by comparing the phase of the second clock with a phase of a clock obtained by delaying the first clock by the delay amount; and
a phase difference detection signal generator configured to set a logic level of a phase difference detection signal corresponding to a phase difference between the first and second clocks in response to signals respectively outputted from the first to third phase detectors, detect that the phase of the first or second clock is changed by a phase corresponding an amount two times greater than the delay amount, and change the logic level of the phase difference detection signal in response to the detected result.

2. The semiconductor device of claim 1, further comprising a clock phase shifter configured to change the phase of the first or second clock in response to the output signal of the first phase detector to synchronize the phases of the first and second clocks to each other and determine the presence of synchronization of the first and second clocks in response to the phase difference detection signal.

3. The semiconductor device of claim 2, wherein the phase difference detection signal generator comprises:
a first phase difference detector configured to detect whether or not the phase of the second clock is within a phase difference corresponding to the delay amount so that the phase of the second clock is later than that of the first clock in response to the signals respectively outputted from the first and second phase detectors;
a second phase difference detector configured to detect whether or not the phase of the second clock is within a phase difference corresponding to the delay amount so that the phase of the second clock is later than that of the first clock in response to the signals respectively outputted from the first and third phase detectors;
a third phase difference detector configured to detect whether or not the phase of the first or second clock is changed by a phase difference corresponding to a delay amount two times greater than the delay amount in response to the signals respectively outputted from the first to third phase detectors; and
a phase difference detection signal output configured to output the phase difference detection signal, and the logic level of the phase difference detection signal is determined in response to the signals respectively outputted from the first to third phase detectors.

4. The semiconductor device of claim 3, wherein, when the logic levels of the signals respectively outputted from the first to third phase detectors that become a non-activated state after an initiation operation are changed into an activated state, the third phase difference detector detects that the phase of the first or second clock is changed by a phase difference corresponding to a delay amount two times greater than the delay amount.

5. The semiconductor device of claim 3, wherein, when an operational condition of any one of the first to third phase difference detectors is satisfied, the phase difference detection signal output activates the phase difference detection signal.

6. The semiconductor device of claim 5, wherein, when the phase difference detection signal is activated, the clock phase shifter determines that the phases of the first and second clocks are synchronized with each other and finishes its operation.

7. A delay locked loop (DLL) circuit, comprising:
a phase comparator configured to compare phases of a source clock and a feedback clock and generate a phase comparison signal and a phase difference detection signal corresponding to the compared result;
a clock delay configured to delay the source clock through a variable delay line and output the delayed source clock as a delay locked clock, wherein the variable delay line controls the variation width of a delay amount in response to the phase difference detection signal and controls the variation direction of the delay amount in response to the phase comparison signal; and
a replica modeling configured to delay the delay locked clock by a delay amount obtained by modeling an input delay path of the source clock and an output delay path of the delay locked clock and output the delayed delay locked clock as the feedback clock,
wherein the phase comparator comprises:
a first phase detector configured to detect the phase of the feedback clock by comparing the phase of the second clock with the phase of the source clock;
a second phase detector configured to detect a phase of a clock obtained by delaying the feedback clock by a set delay amount by comparing the phase of the delayed second clock with the phase of the source clock;
a third phase detector configured to detect the phase of the feedback clock by comparing the phase of the second clock with a phase of a clock obtained by delaying the source clock by the set delay amount; and
a phase difference detection signal generator configured to set a logic level of the phase difference detection signal corresponding to a phase difference between the source clock and the feedback clock in response to signals respectively outputted from the first to third phase detectors, detect that the phase of the feedback clock is changed by a phase corresponding an amount two times greater than the delay amount, and change the logic level of the phase difference detection signal in response to the detected result.

8. The DLL circuit of claim 7, wherein the phase difference detection signal generator comprises:
a first phase difference detector configured to detect whether or not the phase of the feedback clock is within a phase difference corresponding to the set delay amount so that the phase of the feedback clock is later than that of the source clock in response to the signals respectively outputted from the first and second phase detectors;
a second phase difference detector configured to detect whether or not the phase of the feedback clock is within a phase difference corresponding to the set delay amount so that the phase of the feedback clock is later than that of the source clock in response to the signals respectively outputted from the first and third phase detectors;
a third phase difference detector configured to detect whether or not the phase of the feedback clock is changed by a phase difference corresponding to a delay amount two times greater than the set delay amount in response to the signals respectively outputted from the first to third phase detectors; and
a phase difference detection signal output configured to output the phase difference detection signal, and determine the logic level of the phase difference detection signal in response to the signals respectively outputted from the first to third phase detectors.

9. The DLL circuit of claim 8, wherein, when the logic levels of the signals respectively outputted from the first to third phase detectors that become a non-activated state after an initiation operation are changed into an activated state, the third phase difference detector detects that the phase of the feedback clock is changed by a phase difference corresponding to a delay amount two times greater than the set delay amount.

10. The DLL circuit of claim 8, wherein, when an operational condition of any one of the first to third phase difference detectors is satisfied, the phase difference detection signal output activates the phase difference detection signal.

11. The DLL circuit of claim 10, wherein the clock delay changes a delay amount of the variable delay line with a first variation width in a non-activation period of the phase difference detection signal and changes the delay amount of the variable delay line with a second variation width that is smaller than the first variation width in an activation period of the phase difference detection signal.

12. The DLL circuit of claim 10, wherein the clock delay changes the delay amount of the variable delay line as a unit delay in the non-activation period of the phase difference detection signal, and changes the delay amount of the variable delay line as a delay smaller than the unit delay in the activation period of the phase difference detection signal.

* * * * *